United States Patent [19]

Tustaniwskyj et al.

[11] Patent Number: 5,579,205
[45] Date of Patent: Nov. 26, 1996

[54] ELECTROMECHANICAL MODULE WITH POST-SOLDER ATTACHABLE/REMOVABLE HEAT SINK FRAME AND LOW PROFILE

[75] Inventors: Jerry I. Tustaniwskyj, Mission Viejo; Stephen A. Smiley, San Diego, both of Calif.

[73] Assignee: Unisys Corporation, Blue Bell, Pa.

[21] Appl. No.: 519,956

[22] Filed: Aug. 28, 1995

[51] Int. Cl.⁶ .................................................. H05K 7/20
[52] U.S. Cl. ........................... 361/704; 24/545; 248/510; 257/719; 361/719
[58] Field of Search ........................ 24/456, 457, 464, 24/481, 482, 485, 530, 531, 545–547, 555, 568; 248/316.7, 505, 506, 510; 174/16.3; 165/80.3, 185; 411/511, 516, 530; 257/706, 707, 713, 718, 719; 361/689, 690, 704, 705, 707, 717–719; 267/150, 160

[56] References Cited

U.S. PATENT DOCUMENTS

| | | | |
|---|---|---|---|
| 4,716,494 | 12/1987 | Bright | 361/386 |
| 4,745,456 | 5/1988 | Clemens | 357/79 |
| 5,299,632 | 4/1994 | Lee | 165/80.3 |
| 5,323,845 | 6/1994 | Kin-shon | 165/80.3 |
| 5,397,919 | 3/1995 | Tata | 257/717 |
| 5,448,449 | 9/1995 | Bright | 361/704 |

*Primary Examiner*—Gerald P. Tolin
*Attorney, Agent, or Firm*—Charles J. Fassbender; Mark T. Starr; Steven R. Petersen

[57] ABSTRACT

An electromechanical module comprises an IC package having a top surface which dissipates heat and a heat sink which is held by a frame in direct thermal contact with the top surface. This frame includes a pair of spaced-apart elongated beams and a pair of end members which connect to opposite ends of the beams; and the beams together with the end members surround the IC package and expose all of the top surface. Thus, the heat sink can be in direct thermal contact with all of the top surface and can extend past it without having to step up to get over the frame. To attach/remove the frame from the IC package, each end member has at least one leg with a lip that catches on the bottom surface of the IC package; and, when the beams are manually bowed, the lips on the legs move further apart and past the bottom surface.

15 Claims, 5 Drawing Sheets

ELECTROMECHANICAL MODULE WITH POST-SOLDER ATTACHABLE/REMOVABLE HEAT SINK FRAME AND LOW PROFILE

BACKGROUND OF THE INVENTION

This invention relates to the structure and operation of electromechanical modules of the type which include an integrated circuit package (hereinafter IC package) and a heat sink that is mechanically pressed against the IC package. By an IC package is herein meant, an enclosure which contains one or more integrated circuit chips and has input/output terminals for sending/receiving electrical signals to/from the enclosed chips. Typically, the enclosure is made of ceramic, or plastic, or an epoxy glass.

In a Pin Grid Array IC Package, the input/output terminals are an array of metal pins which extend perpendicular to the enclosure and get soldered into plated through holes in a printed circuit board. In a Cast Column Grid Array IC Package, the input/output terminals are an array of cast metal columns which extend perpendicular to the enclosure and get soldered to signal pads on the surface of a printed circuit board. In a Ball Grid Array IC Package, the input/output terminals are an array of metal balls which get soldered to signal pads on the surface of a printed circuit board. These metal balls can be made of a metal which stays solid when the solder melts, or the metal balls can be made of the solder itself.

One way in which a heat sink has been attached to an IC package in the prior art is with an epoxy or solder. However, a problem occurs with such an attachment if the IC package and the heat sink are made of materials which have substantially different thermal expansion rates. In that case, the epoxy/solder joint and the IC package can become stressed and crack when the IC package is subjected to temperature cycles during normal operation.

Also when the heat sink is soldered/epoxied to the IC package, another problem arises when the IC package becomes defective and needs to be de-soldered from the printed circuit board. In that case, the heat sink on the IC package will draw heat away from the input/output terminals during a desoldering operation; and consequently, the task of melting the solder on the input/output terminals becomes difficult. If too much heat is used, one or more input/output terminals on an adjacent IC package can accidently become de-soldered.

To avoid the above problems, several electromechanical modules have been disclosed in the prior art in which a heat sink is mechanically pressed against the IC package. This allows the heat sink and the IC package to slide against each other during temperature cycling in normal operations; and it allows the heat sink to be easily removed from the IC package before a de-soldering operation. Such modules are described in the following U.S. Pat. Nos. 4,719,494 to Bright, et al.; U.S. Pat. No. 5,208,731 Bloomquist; U.S. Pat. No. 4,679,118 to Johnson, et al.; U.S. Pat. No. 4,745,456 to Clemens; U.S. Pat. No. 5,019,940 to Clemens; and U.S. Pat. No. 5,307,239 to McCarty, et al. However, in all of the above patents, the electromechanical modules which are described have other drawbacks.

In the first three patents, '494 and '731 and '118, the electromechanical module includes a socket which has input/output terminals that get soldered into a printed circuit board. Then, the input/output terminals of the IC package are mechanically pressed against corresponding contacts in the socket. Also, the socket provides a mechanism by which the heat sink is mechanically pressed against the IC package.

However, a problem with the above structure is that the input/output terminals of the IC package itself are not soldered. Instead, only mechanical connections are made between the input/output terminals of the IC package and the contacts in the socket; and such mechanical connections are less reliable than soldered connections.

Another problem with the above sockets is that the mechanical connections between the input/output terminals on the IC package and the socket contacts take more space than a corresponding number of soldered connections. Consequently, the size of the IC package must be made larger than it could otherwise be if the input/output terminals were soldered directly into the printed circuit board.

Still another problem with the above sockets is that they add parasitic inductance to the input/output terminals of the IC package. This inductance arises from the mechanical contacts on the socket, the input/output terminals on the socket which got soldered into the printed circuit board, and their interconnections within the socket. Such inductance is undesirable because it slows down the speed with which signals can be sent to/received from the IC package.

In the next two patents, '940 and '456, the electromechanical module which is described contains no socket, and the input/output terminals of the IC package are soldered directly into the printed circuit board. This is achieved by providing a heat sink frame (hereinafter frame) which surrounds the IC package and attaches to the perimeter of the IC package. Input/output terminals of the IC package pass through the surrounding frame and get soldered directly to the printed circuit board; and a spring attaches to the frame and presses the heat sink against the IC package.

However, a problem with these two electromechanical modules is that the frame cannot be removed from the IC package prior to a de-soldering operation in which a defective IC package is to be removed from the printed circuit board. Thus, the frame must continue to surround the IC package while it is de-soldered from the printed circuit board. This is undesirable because such de-soldering is often accomplished by passing a focused stream of hot gas past the input/output terminals of the IC package in order to melt the solder; and the presence of the frame around the IC package will impede the flow of the gas. Consequently, one or more input/output terminals can heat up and get de-soldered on another IC package on the printed circuit board which lies adjacent to the IC package that is to be removed.

Another problem with the above electro-mechanical modules is that the frame must be attached to the IC package before the IC package is soldered into the printed circuit board. This limitation makes the module unsuitable for use with surface mounted IC packages, like the previously described Cast Column Grid Array IC package and Ball Grid Array IC package. When a surface mounted IC package is soldered to the printed circuit board, the surface tension in the melted solder is used to precisely move the IC package such that input/output terminals align with the signal pads on the printed circuit board. But, the presence of a frame around the IC package will hinder this movement and can cause misalignment between the input/output terminals and the signal pads.

In remaining patent '239, the above two problems are overcome in that an electromechanical module is disclosed which includes a frame that holds a heat sink against an IC package; and, the frame can—a) be attached to the IC package after the IC package is soldered to the printed circuit board, and b) be removed from the IC package before the IC package is de-soldered from the printed circuit board. However, in patent '239, the frame is structured such that it must rest on top of the IC package in the completed module in order to be held in place; and the frame must have room to slide on top of the IC package in order to be attached or removed. Consequently, none of the area on the top of the IC package which is used by the frame can be contacted by the base of the heat sink, and this limitation hinders the extent to which the IC package can be cooled.

In addition, in patent '239, the frame will block the flow of air past the cooling fins on the heat sink unless the base of the heat sink is taller than the frame. Thus, the frame limits the minimum profile of the complete electromechanical module. However, any increase in the height of the module has a serious ramification in high speed digital computer systems where multiple printed circuit boards which hold the modules are mounted side-by-side on a backplane. There, the increased height of the module will increase the board-to-board spacing on the backplane; and that in turn will make the signal lines longer on the backplane and cause the system to run at a slower speed. For example, a 20% increase in the spacing of the printed circuit boards which causes a corresponding decrease in the operating speed of a high speed computer system would be disastrous to the marketability of the product.

This speed problem is made worse in patent '239 when, in order to cool the IC package sufficiently, the heat sink base needs to be so large that it extends past the frame. In that case, the heat sink base must include a pedestal in order to get over the frame. But such a pedestal in the heat sink base further increases the height of the complete module, which in turn increases board-to-board spacing and decreases operating speed.

Accordingly, a primary object of the invention is to provide a novel and improved electromechanical module in which all of the above-described drawbacks are overcome.

BRIEF SUMMARY OF THE INVENTION

An electromechanical module which is herein disclosed comprises: an IC package having a top surface which dissipates heat and a bottom surface from which input/output terminals extend, a heat sink which draws heat from the top surface, a frame which attaches to the IC package, and a spring which connects to the frame and holds the heat sink in place. Further, in accordance with the present invention, the frame includes a pair of spaced-apart elongated beams and a pair of end members which connect to opposite ends of the beams;

the beams together with the end members surround the IC package and expose all of the top surface, and the heat sink is in direct thermal contact with the top surface;

each end member has at least one leg which extends toward the bottom surface of the IC package, and each leg has a lip that catches on the bottom surface; and, the beams are structured to bow at their center towards the bottom surface of the IC package and thereby move the lips on the legs further apart and past the bottom surface.

With the above electromechanical module, all of the technical problems with the prior art which are pointed out in the "Background of the Invention" are overcome. And, how these problems are overcome is explained in detail in the "Detailed Description."

DETAILED DESCRIPTION

Figure 1:
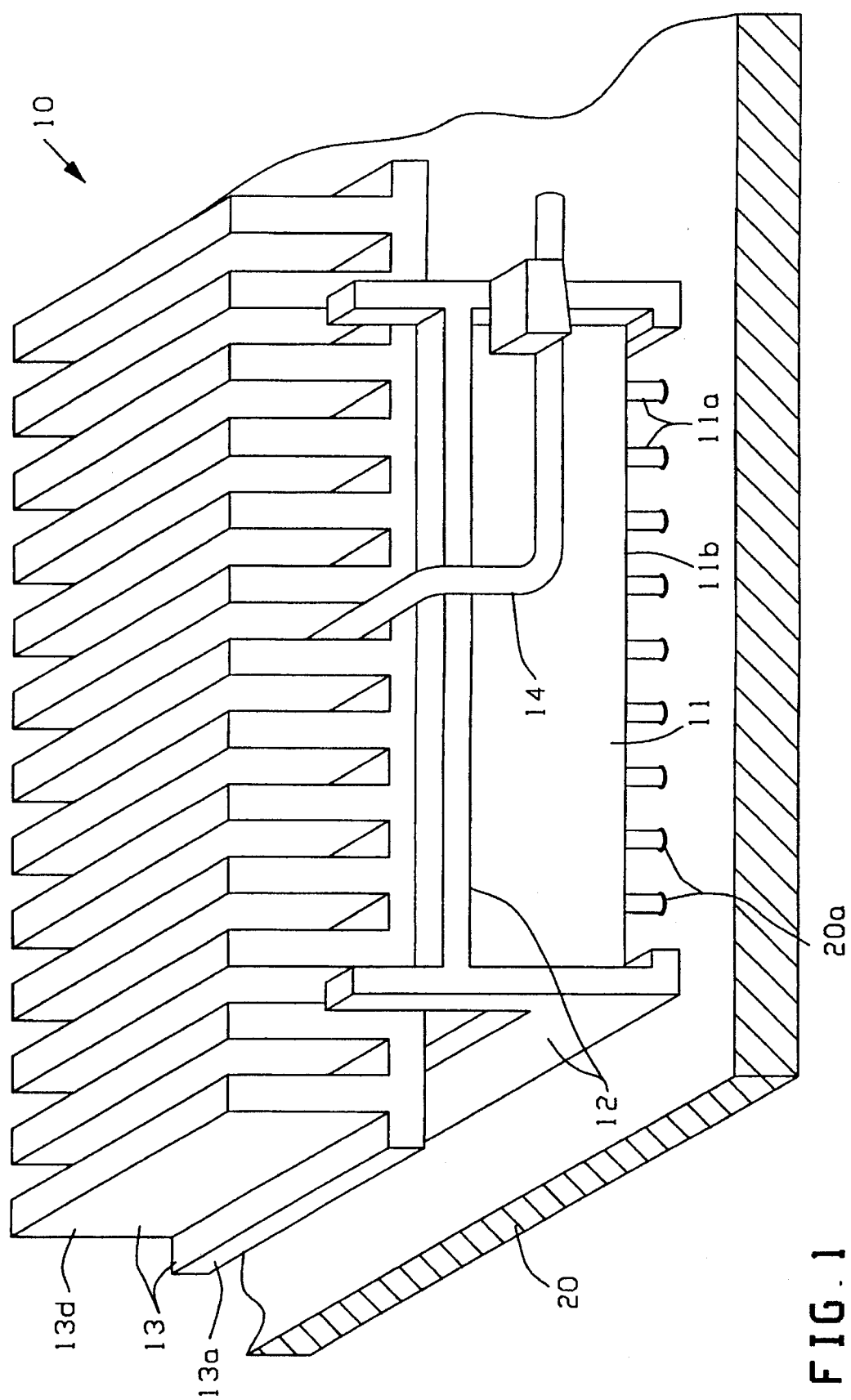
FIG. 1 is a pictorial view of an electromechanical module which constitutes one preferred embodiment of the invention.

Referring now to FIG. 1, the details of an electromechanical module 10 which constitutes one preferred embodiment of the present invention will be described. One of the components in this module 10 is an IC package 11, and enclosed within the IC package 11 are one or more integrated circuit chips (not shown). Electrical signals are sent to/received from those chips via a plurality of input/output terminals 11a which extend from a bottom surface 11b of the IC package. In FIG. 1, the input/output terminals 11a are shown as cast metal columns; but as an alternative, the terminals 11a can be metal pins or metal balls as discussed in the Background of the Invention.

To form a larger assembly, the input/output terminals 11a of the modules 10 are soldered to corresponding signal pads 20a on a printed circuit board 20. Then, to form a complete high speed digital computer system, several of the printed circuit boards are mounted side-by-side on a backplane.

Also included in the module 10 is a frame 12 which attaches to the IC package 11. This frame 12 is a key novel component within the module 10; and the structure of the frame 12 is described in detail in conjunction with FIG. 3 wherein the frame is shown by itself. Also, the manner in which the frame 12 is attached to/removed from the IC package is described in detail in conjunction with FIGS. 4A–4B.

Two remaining components in the module 10 are a heat sink 13 and a spring 14. This heat sink 13 lies against the top surface of the IC package 11; and, the heat sink 13 is pressed against the top surface of the IC package 11 by the spring 14 which connects to the frame 12.

Figure 2:
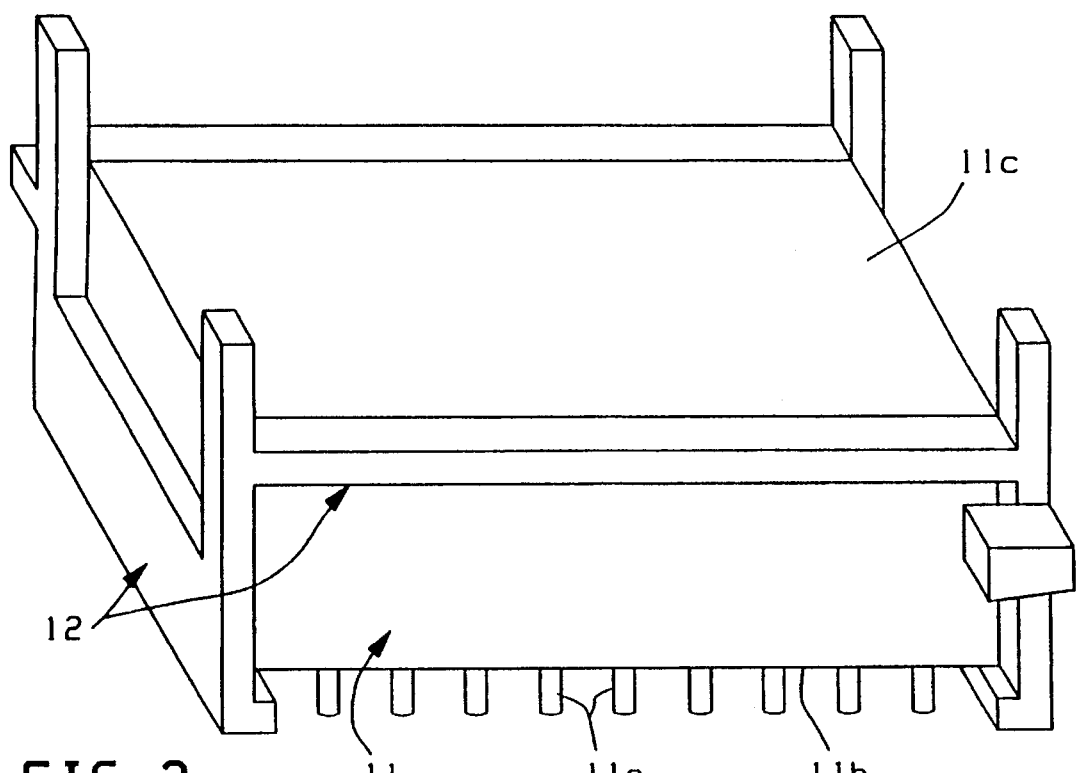
FIG. 2 shows the electromechanical module of FIG. 1 after the heat sink and the spring are removed from the module.

An important feature of the module 10 is that the frame 12 enables the heat sink 13 to lie against the entire top surface of the IC package 11. In FIG. 1, the top surface of the IC package is hidden from view by the heat sink 13; but in FIG. 2, the heat sink 13 is removed from the module 10 and the top surface of the IC package is identified by reference numeral 11c.

Having the heat sink 13 lie against all of the top surface 11c of the IC package is important because each integrated circuit chip in the IC package dissipates heat which causes the temperature of the IC package to rise. If the temperature rise of the IC package 11 gets too large, an integrated circuit chip within the IC package can malfunction; and the magnitude of that temperature rise increases as the contact area between the heat sink 13 and the top surface 11c of the IC package decreases.

A second important feature of the module 10 is that the frame 12 enables the heat sink 13 to have a flat base 13a which extends past the top surface of the IC package. This large flat base 13a together with the cooling fins 13b keep the IC package cooler than it would otherwise be if the heat sink base matched the top surface of the IC package.

Another important feature is that the module 10 has a low profile. This low profile occurs because the frame 12 surrounds the IC package instead of resting on its top surface; and thus the height of the frame does not add to the height of the module 10. Consequently, when the module 10 is used in a system where multiple printed circuit boards are mounted side-by-side on a backplane, the board-to-board spacing is not increased by the height of the frame. Thus, the length of the signal lines on the backplane between the boards is not increased; and the operating speed of the system is not decreased.

Still another important feature of the module 10 is that the frame 12 (as well as the heat sink 13 and spring 14) can be removed from the module before the IC package 11 is de-soldered from the printed circuit board. Such a de-soldering operation will be needed if an integrated circuit chip within the IC package 11 happens to fail, because then, the IC package 11 will need to be replaced.

During a de-soldering operation, the solder needs to be melted on all of the input/output terminals 11a of just one particular IC package. This can be achieved by heating all of those terminals with a focused stream of hot gas. However, if the frame 12 is kept on the IC package 11 during this de-soldering operation, then the flow of the hot gas past all of the input/output terminals 11a will be impeded; and consequently, the time duration and/or temperature of the hot gas flow will have to be increased. But that is undesirable because one or more input/output terminals of an adjacent module 10 on the printed circuit board can accidently get de-soldered.

A related important feature of the module 10 is that frame 12 (as well as the heat sink 13 and spring 14) can be attached to the IC package 11 after the IC package has been soldered into the printed circuit board. This is important because during the soldering operation, the solder must be melted by exposing it to a high temperature. By having the frame 12 removed from the module 10 during the soldering operations, the frame is not exposed to that high temperature which could otherwise cause damage.

Also, when the IC package 11 is surface mounted to the signal pads on the printed circuit board, the above feature of being able to attach the frame 12 to the IC package 11 after the soldering operation is especially important. When a surface mounted IC package 11 is soldered to the printed circuit board 20, the surface tension in the melted solder causes the surface area of the melted solder to shrink and thereby move the IC package until the input/output terminals 11a lie precisely over the signal pads 20a. But that movement will be impeded if the frame 12 is attached to the IC package.

Figure 3:
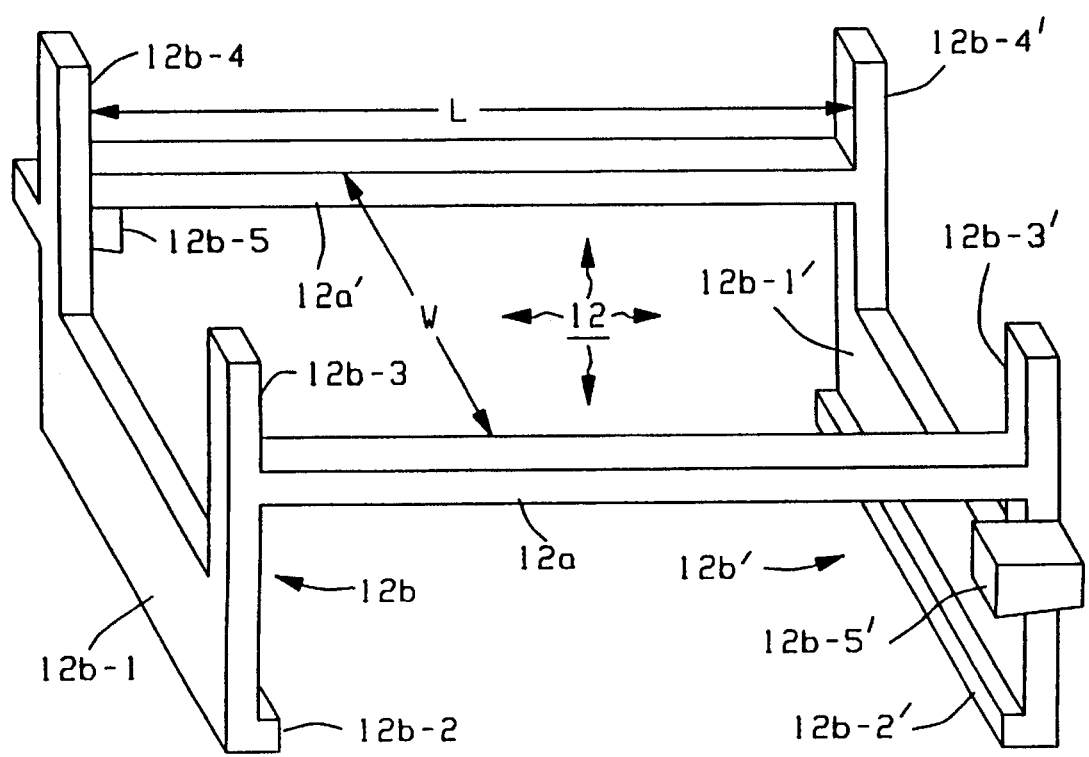
FIG. 3 is a pictorial view of a frame which is included in the electromechanical module of FIG. 1.

Now in accordance with the present invention, the above features are achieved by structuring the frame 12 as shown in FIG. 3. This frame 12 includes a pair of spaced-apart elongated beams 12a and 12a', and it includes a pair of end members 12b and 12b' which connect to opposite ends of the beams. Each of the beams 12a and 12a' have a length L which is slightly larger than the length of the integrated circuit package 11, and those beams are spaced apart by a width W which is slightly larger than the width of the integrated circuit package. Consequently, the beams 12a and 12a' together with the end members 12b and 12b' surround the IC package 11 and enable all of the top surface 11c of the IC package to be contacted by the heat sink 13.

Also in the frame 12, each of the end members 12b and 12b' has a respective leg 12b-1 and 12b-1' which extends towards the bottom surface 11b of the IC package. Further, each of the legs 12b-1 and 12b-1' respectively has a lip 12b-2 and 12b-2' which catches on the bottom surface 11b of the IC package. Preferably, each lip 12b-2 and 12b-2' extends onto the bottom surface 11c of the IC package by a distance which is short enough to prevent contact with the input/output terminals.

Further in the frame 12, the end member 12b has a pair of lever arms 12b-3 and 12b-4; and the other end member 12b' similarly has a pair of lever arms 12b-3' and 12b-4'. When the lever arms on the two end members 12b and 12b' are manually squeezed towards each other, the lips on the legs 12b-1 and 12b-1' move apart past the bottom surface of the IC package. This movement, which is illustrated in FIG. 4A, enables the frame 12 to be attached to the IC package 11 after the package is soldered to the printed circuit board; and it enables the frame to be removed from the IC package before the package is de-soldered from the printed circuit board.

Figure 4A:
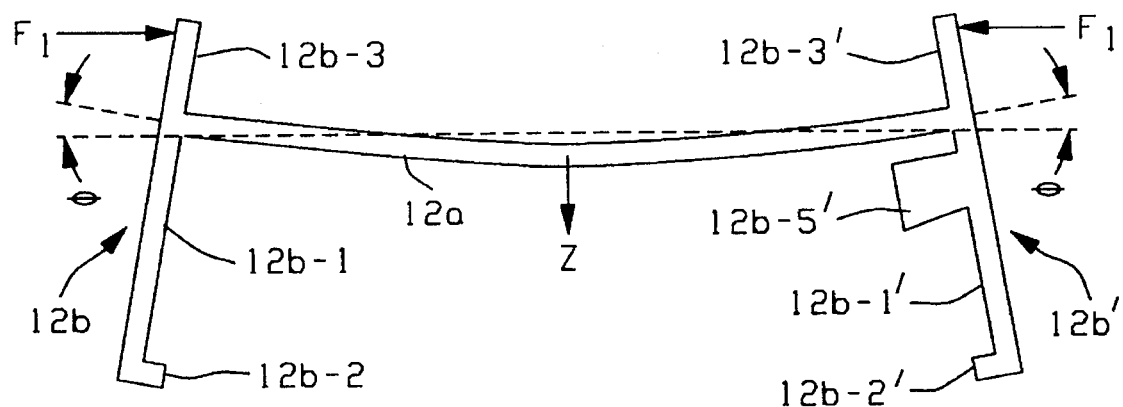
FIG. 4A is a schematic diagram which illustrates how the frame is attached to/removed from an IC package in the FIG. 1 module.

Specifically in FIG. 4A, two of the lever arms 12b-3 and 12b-3' are squeezed towards each other by a manually applied force $F_1$. In response, the elongated beam 12a bows its center in a direction Z towards the bottom surface of the IC package. Consequently, the legs 12b-1 and 12b-1' pivot by an angle e on the ends of the beam 12a; and that in turn causes the lips 12b-2 and 12b-2' to move apart. Once the lips are moved apart by a distance which exceeds the length L of the IC package, the frame 12 is free to move onto or off of the IC package.

Figure 4B:
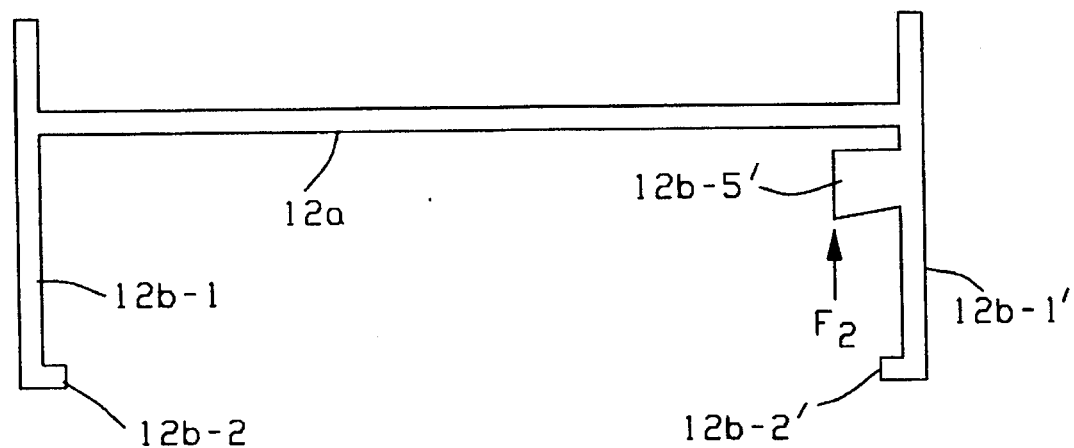
FIG. 4B is a schematic diagram which illustrates how the spring in the FIG. 1 module tends to keep the frame attached to the IC package in the module.

Additionally in the frame 12, each of the end members 12b and 12b' has a respective projection 12b-5 and 12b-5' on which the spring 14 catches. When the spring 14 is in place, the spring exerts a force against the projections 12b-5 and 12b-5' in a direction towards the top surface 11c of the IC package. In FIG. 4B, this force is shown on the projection 12b-5' as a force $F_2$; and due to that force, the leg 12b-1' tends to pivot on the end of the beam 12a towards the other leg 12b-1. At the same time, a similar force is exerted by the spring 14 on the other projection 12b-5; and consequently, the leg 12b-1 tends to pivot towards the leg 12b-1'. Thus, the spring prevents the lips 12b-2 and 12b-2' from moving apart and off of the bottom surface 11b of the IC package.

One preferred embodiment of the invention has now been described in detail. In addition, however, various changes and modifications can be made to that one embodiment to thereby form other preferred embodiments; and, these modifications will now be described in conjunction with FIGS. 5, 6, and 7.

Figure 5:
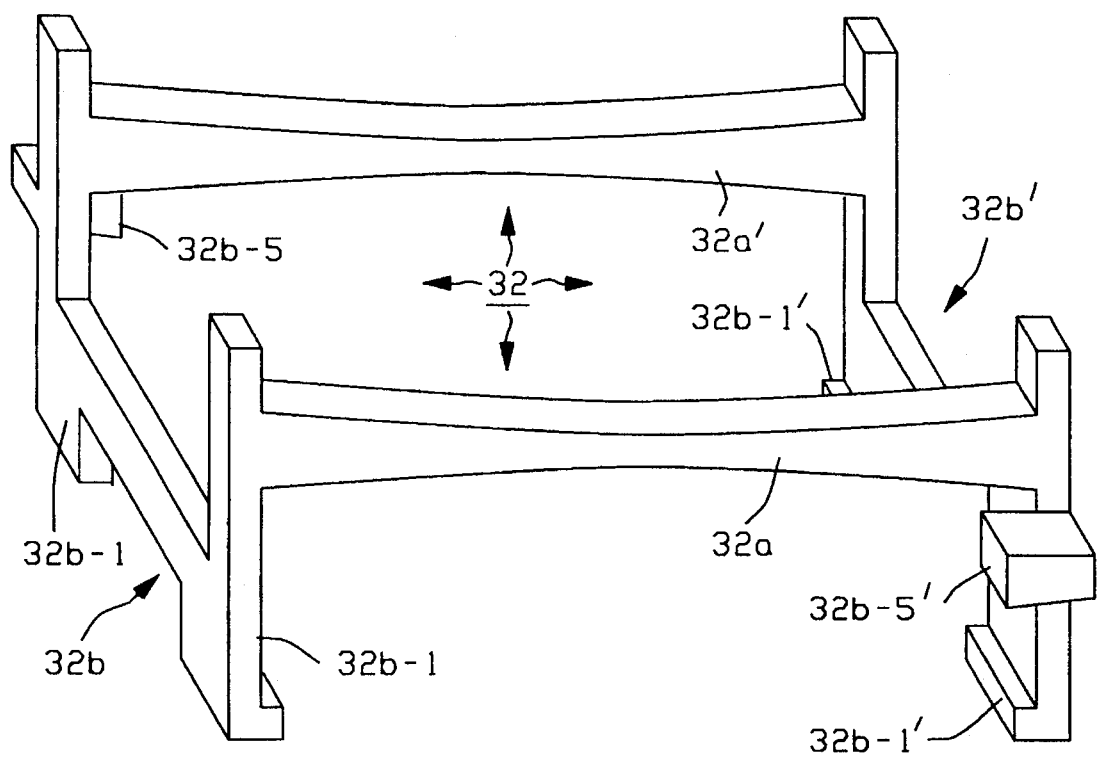
FIG. 5 is a pictorial view of a second embodiment for the frame in the FIG. 1 module.

In FIG. 5, a frame 32 is shown which has the same structure as the previously described frame 12 of FIGS. 1–4B except for two modifications. One of these modifications is that the frame 32 contains a pair of elongated beams 32a and 32a' which have a non-uniform cross section, whereas in the frame 12, the corresponding beams 12a and 12a' have a uniform cross section. More specifically in FIG.

5, each of these elongated beams 32a and 32a' has a cross section which gets progressively larger in height as the beams are transversed from their center to the end members 32b and 32b'. This shape reduces mechanical stress concentrations which occur on the ends of the beams when the beams are bent as shown in FIG. 4A; and consequently, the overall strength of the frame is improved.

Also in the frame 32 of FIG. 5, a second modification is that each of the end members 32b and 32b' has a pair of legs which are smaller than the width W of the IC package to which the frame connects. Both legs on the end member 32b are identified by reference numeral 32b-1; and both legs on the end member 32b' are identified by reference numeral 32b-1'.

Figure 6:
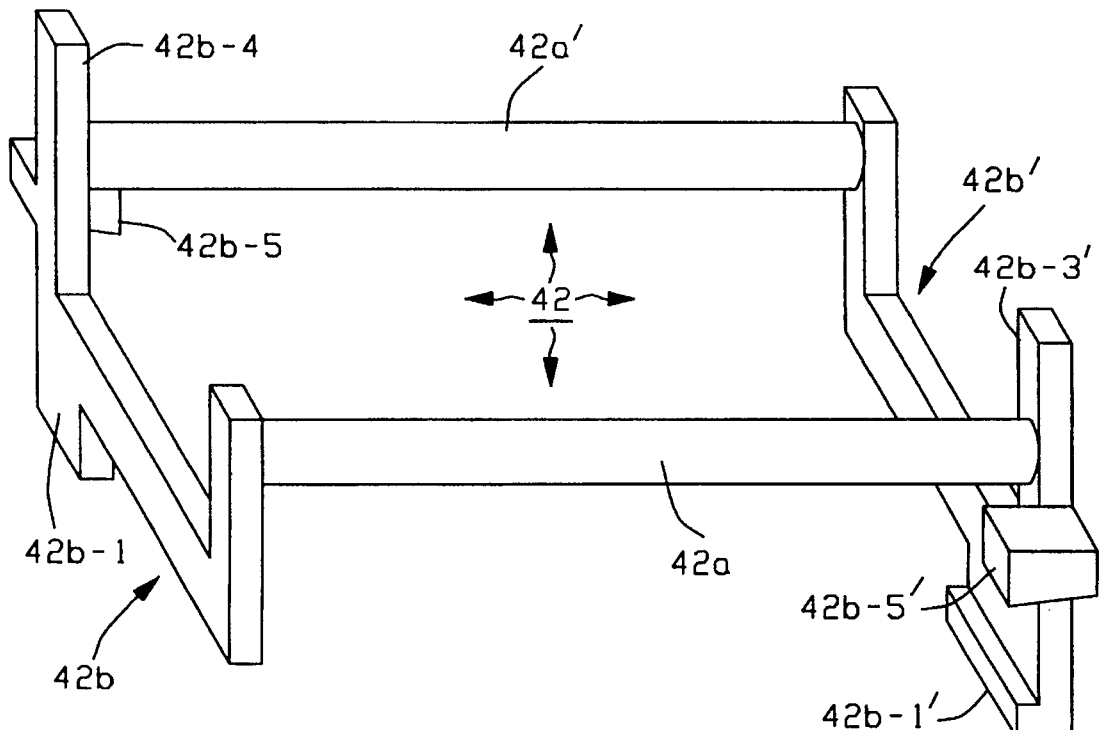
FIG. 6 is a pictorial view of a third embodiment for the frame in the FIG. 1 module.

Next in FIG. 6, a frame 42 is shown which has the same structure as the previously described frame 12 of FIGS. 1–4B except for three modifications. One of these modifications is that the frame 42 contains a pair of elongated beams 42a and 42a' which have a circular cross section; whereas in the frame 12, the corresponding beams 12a and 12a' have a rectangular cross section.

Also in the frame 42 of FIG. 6, a second modification is that each of the end members 42b and 42b' has a single leg which is less than half the width W of the IC package to which the frame connects. This leg on end member 42b is identified by reference numeral 42b-1; and this leg on end member 42b' is identified by reference numeral 42b-1'.

A third modification in the frame 42 of FIG. 6 is that each of the end members 42b and 42b' contains just a single lever arm; whereas in the frame 12, each of the corresponding end members 12b and 12b' have a pair of lever arms. In FIG. 6, the lever arm on end member 42b is identified by reference numeral 42b-4; and the lever arm on end member 42b' is identified by reference numeral 42b-3'.

Figure 7:
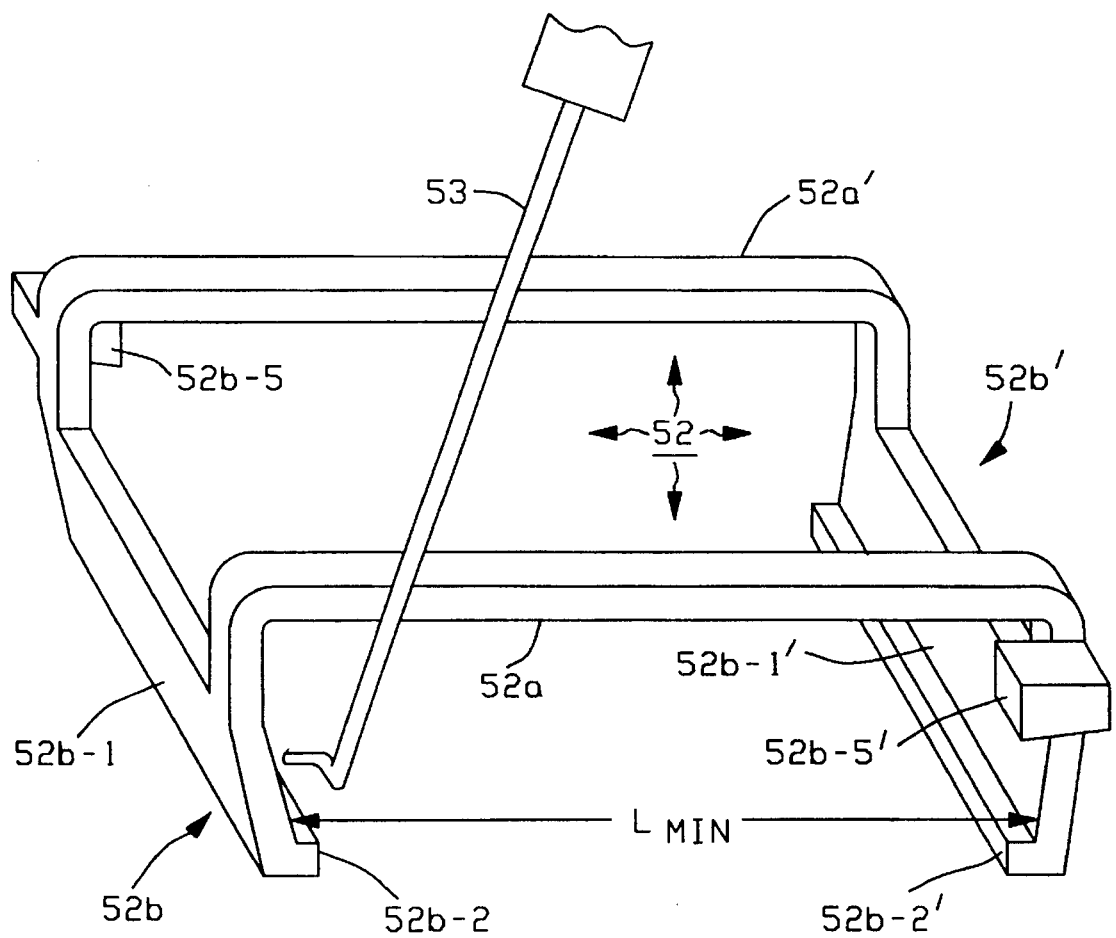
FIG. 7 is pictorial view of a fourth embodiment for the frame in the FIG. 1 module.

Next, in FIG. 7, a frame 52 is shown which has the same structure as the previously described frame 12 of FIGS. 1–4B, except for two modifications. One modification is that the end members 52b and 52b' contain no lever arms at all. Instead, a separate tool 53 is provided by which the legs 53b-1 and 52b-1' of the frame are manually moved apart. By using this tool 53, the frame 12 is attached to and removed from an IC package.

Also in the frame 52 of FIG. 7, a second modification is that the legs 52b-1 and 52b-1' are not vertical; but instead, the legs slope slightly towards each other. With this modification, the frame 52 is able to accommodate larger variations than it otherwise could in the length L of the IC package. At the bottom of legs immediately above the lips 52b-2 and 52b-2', the legs are spaced by a distance $L_{min}$ which equals the minimum length of the IC package to which the frame 52 is to be attached. When the IC package has a length which is larger than the distance $L_{min}$, the legs 52b-1 and 52b-1' are simply forced apart when the frame is attached to the IC package in order to accommodate the increased length.

Now, in the above FIGS. 5, 6, and 7, a total of seven modifications have been described; and, it is to be understood that those modifications can be used in any combination. For example, the frame 42 of FIG. 6 can be modified such that the elongated beams 42a and 42a' have a non-uniform circular cross section which gets progressively larger as the beams are traversed from their center to the end members. Similarly, the frame 42 of FIG. 6 can be modified by deleting the lever arms 42b-4 and 42b-3'; and by providing a tool 53 for manually moving the legs of the frame apart.

Also, as yet another modification, the heat sink 13 in the FIG. 1 module need not be in direct physical contact with the top surface of the IC package 11. Instead, a thin layer of thermal grease or a thermal pad can be disposed between the top surface of the IC package 11 and the heat sink 13. Similarly, a thin spongy porous member which holds a liquid metal in its pores can be disposed between the top surface of the IC package 11 and the heat sink 13. Such a member is disclosed in U.S. Pat. No. 5,323,294 which is assigned to the assignee of the present invention. Thus, in the claims which follow, the phrase "in direct thermal contact with" is defined to mean any one of the above four connections between the heat sink and the IC package, as well as any similar connection which reduces the contact thermal resistance between the IC package top surface and the heat sink.

As another modification, the heat sink 13 can be changed in size and shape from that which is shown in FIG. 1. For example, the heat sink can be reduced in width such that a portion of the top surface of the IC package 13 is exposed parallel to the two beams in the frame. As a second example, the heat sink can be reduced in length such that the base of the heat sink coincides with the top surface of the IC package 13. As a third example, the heat sink can be reduced in both length and width such that its base is smaller than the top surface of the IC package 12. In these three examples, the IC package will get cooled progressively less; but in each example, the complete electromechanical module will have a post-solder attachable/removable heat sink frame and have a low profile.

Accordingly, it is to be understood that the present invention is not limited to just any one particular embodiment but is defined by the appended claims.

What is claimed is:

1. An electromechanical module comprising: an IC package having a top surface which dissipates heat and a bottom surface from which input/output terminals extend, a heat sink which draws heat from said top surface, a frame which attaches to said IC package, and a spring which connects to said frame and holds said heat sink in place; wherein said frame includes a pair of spaced-apart elongated beams and a pair of end members which connect to opposite ends of said beams;

said beams together with said end members surround said IC package and expose all of said top surface, and said heat sink is in direct thermal contact with said top surface;

each end member has at least one leg which extends toward the bottom surface of said IC package, and each leg has a lip that catches on said bottom surface; and, said beams are structured to bow at their center towards the bottom surface of said IC package and thereby move the lips on said legs further apart and past said bottom surface.

2. A module according to claim 1 wherein said frame further includes two projections for catching said spring thereunder such that said beams are urged by said spring to bow away from the bottom surface of said IC package, and the lips on said legs are urged to move together.

3. A module according to claim 1 wherein each end member has a single leg which is at least as wide as said IC package.

4. A module according to claim 1 wherein each end member has a pair of legs which are smaller in width than said IC package.

5. A module according to claim 1 wherein each end member has a single leg which is smaller in width than said IC package.

6. A module according to claim 1 wherein said legs on said end members slope towards each other.

7. A module according to claim 1 wherein each end member has a pair of lever arms for bowing the center of the beams towards the bottom surface of said IC package and thereby moving the lips of said legs past said bottom surface.

8. A module according to claim 1 wherein each end member has a single lever arm for bowing the center of the beams towards the bottom surface of said IC package and thereby moving the lips of said legs past said bottom surface.

9. A module according to claim 1 wherein neither end member has any lever arms, and a separate tool is provided for moving the lips of said legs past said bottom surface.

10. A module according to claim 1 wherein said beams have a uniform rectangular cross-section.

11. A module according to claim 1 wherein said beams have a uniform round cross-section.

12. A module according to claim 1 wherein said beams have a non-uniform cross-section which is wider at the beam ends than at the beam center.

13. A module according to claim 1 wherein said heat sink is in direct thermal contact with all of said top surface of said IC package.

14. A module according to claim 1 wherein said frame lies below said top surface of said IC package, and said heat sink extends laterally past said top surface.

15. A frame attaching a heat sink to an IC package which has top and bottom surfaces; wherein said frame includes a pair of spaced-apart elongated beams and a pair of end members which connect to opposite ends of said beams;

said beams together with said end members surround said IC package and expose all of said top surface;

each end member has at least one leg which extends toward the bottom surface of said IC package, and each leg has a lip that catches on said bottom surface; and, said beams are structured to bow at their center towards the bottom surface of said IC package and thereby move the lips on said legs further apart and past said bottom surface.

* * * * *